United States Patent [19]
Odagawa et al.

[11] Patent Number: 6,147,360
[45] Date of Patent: Nov. 14, 2000

[54] SUPERCONDUCTING DEVICE AND A METHOD OF MANUFACTURING THE SAME

[75] Inventors: Akihiro Odagawa, Nara; Hideaki Adachi, Hirakata; Kentaro Setsune, Sakai, all of Japan

[73] Assignee: Matsushita Electric Industrial Co. Ltd., Osaka, Japan

[21] Appl. No.: 09/082,761

[22] Filed: May 21, 1998

Related U.S. Application Data

[63] Continuation-in-part of application No. 08/803,940, Feb. 20, 1997.

[30] Foreign Application Priority Data

Feb. 22, 1996 [JP] Japan ........................................ 8-34558

[51] Int. Cl.$^7$ .................................................. H01L 29/06
[52] U.S. Cl. ................................................ 257/33; 257/36
[58] Field of Search ........................................ 257/31–36

[56] References Cited

U.S. PATENT DOCUMENTS

| | | | |
|---|---|---|---|
| 5,196,395 | 3/1993 | James et al. ............................... | 505/1 |
| 5,422,497 | 6/1995 | Saitoh et al. ............................... | 257/35 |
| 5,512,151 | 4/1996 | Hayamizu et al. ................. | 204/192.15 |
| 5,552,374 | 9/1996 | Tanaka et al. ........................... | 505/193 |
| 5,627,139 | 5/1997 | Chin et al. ............................... | 505/238 |

*Primary Examiner*—Olik Chaudhuri
*Assistant Examiner*—Douglas A. Wille
*Attorney, Agent, or Firm*—Morrison & Foerster LLP

[57] ABSTRACT

This invention provides a superconducting device with good characteristics that can be reproduced at an arbitrary place on a substrate and a method of manufacturing the same. A convex region (a processed, linearly-shaped platinum thin film) of oriented metal is provided on a substrate as a gate electrode. Then, an oxide insulating film ($SrTiO_3$ thin film) is deposited on the convex region, and further a $YBa_2Cu_3O_7$ oxide superconducting thin film is deposited on the oxide insulating film. Accordingly, a grain boundary part is formed on the convex region. A drain electrode and a source electrode are formed facing each other with the grain boundary part in between.

18 Claims, 7 Drawing Sheets

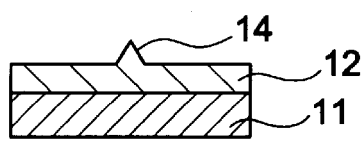

SUPERCONDUCTING DEVICE AND A METHOD OF MANUFACTURING THE SAME

This Application is a continuation-in-part of Ser. No. 08/803,940 filed Feb. 20, 1997.

FIELD OF THE INVENTION

This invention generally relates to a superconducting devices utilizing superconductivity application techniques and a method of manufacturing the same. More particularly, the invention relates to a superconducting device using oxide superconductors and a method of manufacturing the same.

BACKGROUND OF THE INVENTION

When a device having a Josephson junction that is the base of a superconducting device is produced, it is necessary to precisely form a tunnel layer as a barrier. Superconducting coherence length at the interface of a tunnel layer and a superconductor is an important parameter to control to precisely form a tunnel layer in manufacturing a superconducting device.

Superconducting devices having Josephson junctions can be classified into two large groups: laminated type and flat type. Because the superconductive properties of an oxide superconductor that constitutes a superconducting device are sensitive to the crystal structure and composition, deteriorated layers may be produced due to defects at the junction interface. In such a case, if the coherence length is short, good junction properties cannot be obtained. In regard to a c-axis oriented thin film, which is widely used in laminated type devices, because the coherence length in the direction of the c-axis is short, forming a tunnel junction is difficult. Therefore, there have been reproducibility problems in the forming process.

Furthermore, in the field of superconducting devices, it is expected that a device be an integrated device. In an integrated superconducting device, it is known that consistency among the properties of Josephson junctions affects the sensitivity of the device.

In view of the problems described above, research concerning reproducibility has been actively continued. In this respect, flat type devices using grain boundary junctions formed on a bicrystal substrate having one-dimensional grain boundary thereon have good reproducibility, and Josephson junctions can be formed relatively easily in this type of device. However, since the location to form a superconducting device is fixed in this type of device, there have been problems in the integrating process. Therefore, there have been problems in both the laminated type devices and flat type devices for practical use.

Accordingly, there exists a need for a superconducting device having good characteristics which can be reproduced at an arbitrary place on a substrate, and a method of manufacturing the same.

SUMMARY OF THE INVENTION

The invention provides a superconducting device with good characteristics which can be reproduced at an arbitrary place on a substrate, and a method of manufacturing the same.

In particular, the invention provides a superconducting device that includes a substrate including a plane therein, a convex region formed on the substrate, an oxide film formed on the substrate and the convex region, and an oxide superconducting film formed on the oxide film, wherein the convex region is a pyramid or truncated pyramid having a triangular, trapezoidal or higher polygonal shape in a section taken perpendicular to the plane of the substrate. According to the structure of the superconducting device, it is possible to reproduce a superconducting device with good characteristics at an arbitrary position on the substrate by providing the convex region at the position.

Furthermore, in the structure of a superconducting device of the invention, the convex region is preferably of oriented metal. In one embodiment, an oxide film and a superconducting film having good crystal structures can be formed on the convex region, so that a superconducting device with good characteristics can be produced relatively easily. Furthermore, in this case, the oriented metal is preferably platinum.

Furthermore, the convex region in the superconducting device of the invention is preferably linearly shaped.

Also, the oxide film in the superconducting device of the invention is preferably an insulating layer.

Also, the oxide film in the superconducting device of the invention is preferably an oxide compound selected from the group consisting of $Bi_2Sr_2CaCu_2O_x$, $Bi_2Sr_2CuOy$ and $SrTiO_3$.

Also, the oxide superconducting film in the superconducting device of the invention is preferably an oxide compound selected from the group consisting of $Bi_2Sr_2CaCu_2O_x$ and $YBa_2Cu_3O_7$.

Also, the oxide film in the superconducting device of the invention is preferably formed by high temperature annealing. Furthermore, the a precursor of oxide film in the superconducting device of the invention is preferably in a polycrystalline state. Furthermore, the a precursor oxide film in the superconducting device of the invention is preferably in an amorphous state.

Also, the oxide superconducting film in the superconducting device of the invention is preferably formed by high temperature annealing. Furthermore, the a precursor of oxide superconducting film in the superconducting device of the invention is preferably in a polycrystalline state. Furthermore, the a precursor of oxide superconducting film in the superconducting device of the invention is preferably in an amorphous state.

Furthermore, in the structure of a superconducting device of the invention, a grain boundary is preferably formed on the convex region. Furthermore, in this case, a superconducting bridge is preferably formed across the convex region. Furthermore, the superconducting bridge is preferably a wiring pattern. Also, the grain boundary is preferably a Josephson junction. Also, the superconducting device preferably shows current-voltage characteristics having Shapiro steps when microwave is irradiated to the superconducting device at a temperature of about 83 K.

According to a superconducting device having the structure described above, by using an oriented metal (thin metal film) for the linear convex region, it is possible to use the metal (thin metal film) as an electrode for applying an electric field. As such, an electric field effect device that controls carriers in the grain boundary junction part can be produced.

The above features and advantages of the invention will be better understood from the following detailed description taken into conjunction with the accompanying drawings.

DETAILED DESCRIPTION

The invention is explained in further detail with reference to the following embodiments. Although typical embodiments are described in the following, it does not limit this invention in any way.

(Embodiment 1)

Figure 1:
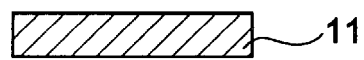
FIG. 1(a)–1(f) are cross-sectional views showing the manufacturing processes of a superconducting device in a first embodiment of the invention.
Figure 1:
Figure 1:
Figure 1:
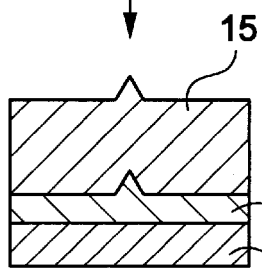
Figure 1:
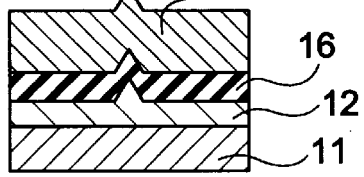
Figure 1:
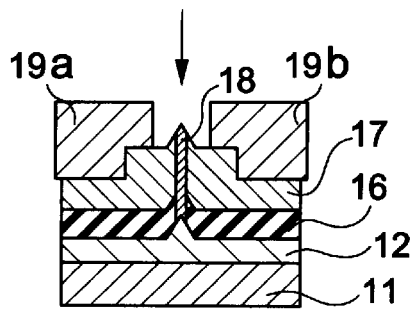

FIG. 1 shows cross-sections perpendicular to the plane of the substrate illustrating manufacturing processes of a superconducting device in a first embodiment of the invention. The manufacturing processes of a superconducting device are explained as follows with reference to FIG. 1(a) to FIG. 1(f).

FIG. 1(a) shows a substrate 11 which constitutes a superconducting device in this embodiment. For example, a $SrTiO_3$ monocrystal substrate can be used as the substrate 11.

In the process shown by FIG. 1(b), a platinum thin film 12 having a thickness of about 100 nm was deposited on the substrate 11 at a temperature of 500° C. with the substrate 11 in an argon atmosphere of 60 m Torr (about 8.0 Pa). The resulting platinum thin film 12 was oriented to the (100) crystal plane. It is to be understood that the substrate formed in this process (the platinum thin film 12 having a thickness of about 100 nm formed on the substrate 11) is hereinafter referred to as the "thin film substrate."

Next, in the process shown in FIG. 1(c), by using a scanning tunneling microscope, a tunnel current of 2 nA was passed and a bias voltage of −4V was applied between the probe 13 of the microscope and the surface of the thin film substrate. By this process, atoms on the surface of the thin film substrate were induced, and a line shaped convex region 14 was formed on the thin film substrate. The probe 13 of the scanning tunneling microscope used in this example may be made of gold or platinum. It was observed that a convex region having a triangular shape in section was formed on the processed region (the region processed in this step) by using an atomic force microscope (AFM), as viewed from a position perpendicular to the plane of the substrate. It was determined that the processed convex region 14 was about 250 nm in width and about 10 nm in height by scanning with the probe 13. The substrate formed in this process is hereinafter referred to as the "processed substrate."

Next, in the process shown by FIG. 1(d), a $Bi_2Sr_2CaCu_2O_x$ oxide superconducting thin film 15 in polycrystal or amorphous state having a thickness of about 200 nm was formed on the processed substrate by sputtering. Then, the oxide superconducting thin film 15 was oriented by conducting high temperature annealing in an atmosphere of mixture of oxygen and nitrogen (containing 2% to 15% of oxygen) at a temperature of about 800° C. to 850° C. FIG. 1(e) shows the state after this process. That is, FIG. 1(e) shows that an oriented oxide superconducting thin film 17 was formed by high temperature annealing. In this state, it was observed that an oxide thin film layer 16 of high resistance was formed between the platinum thin film 12 and the oriented oxide superconducting thin film 17. Furthermore, it was observed that a grain boundary 18 was formed on the convex region 14.

Then, in the process shown in FIG. 1(f), after forming a superconducting bridge with a wiring pattern of 1 μm in width and 10 μm in length to cross the convex region by an etching technique using photolithography and Ar ions so that the grain boundary part 18 became a grain boundary type Josephson junction, metallic electrodes for wiring 19a, 19b were formed, producing a superconducting device. The metalic electrodes for wiring 19a, 19b were formed facing each other with the grain boundary 18 formed in between on the convex region 14. The metallic electrodes for wiring 19a, 19b and the convex region 14 on the platinum thin film 12 function as electrodes of the superconducting device. For example, the metallic electrode for wiring 19a functions as a drain electrode, the metallic electrode for wiring 19b functions as a source electrode, and the convex region 14 on the platinum thin film 12 functions as a gate electrode.

Figure 2:
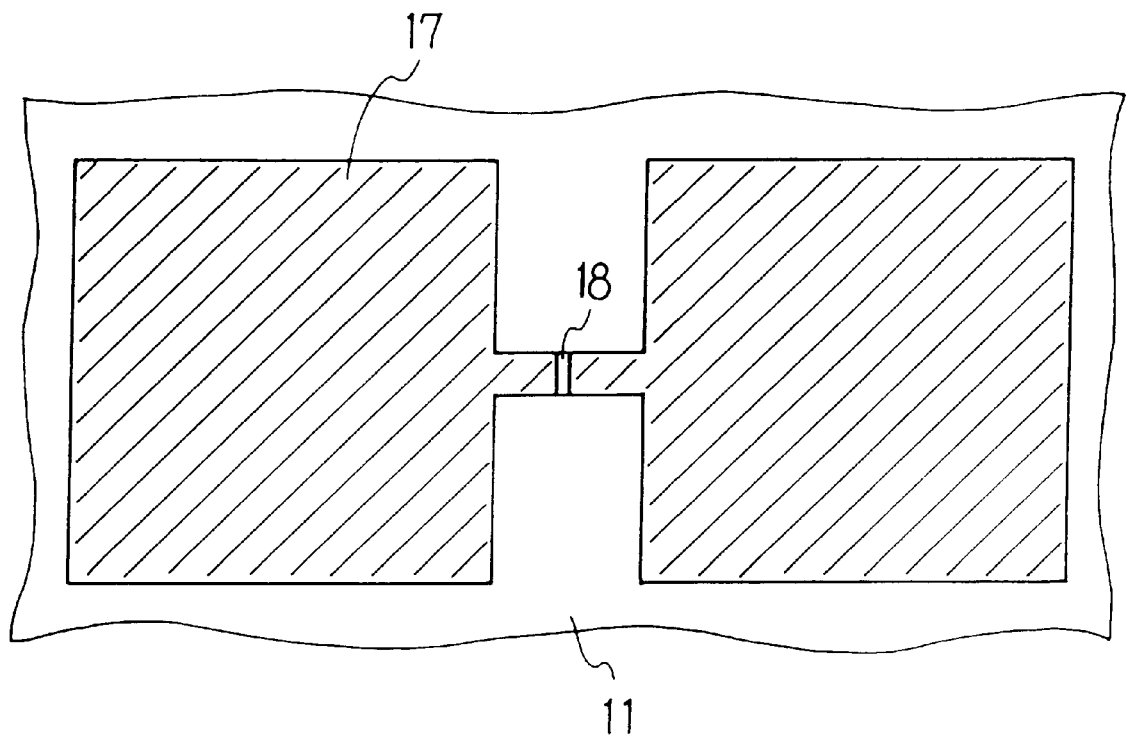
FIG. 2 is a plane view showing the shape of a superconducting device of the first embodiment of the invention.

FIG. 2 is a plane view showing the shape of a superconducting device in this embodiment which was formed by the above described processes. As is apparent from FIG. 2, the oriented oxide superconducting thin film 17 was formed on the substrate 11, and the grain boundary part 18 became a grain boundary type Josephson junction.

Figure 3:
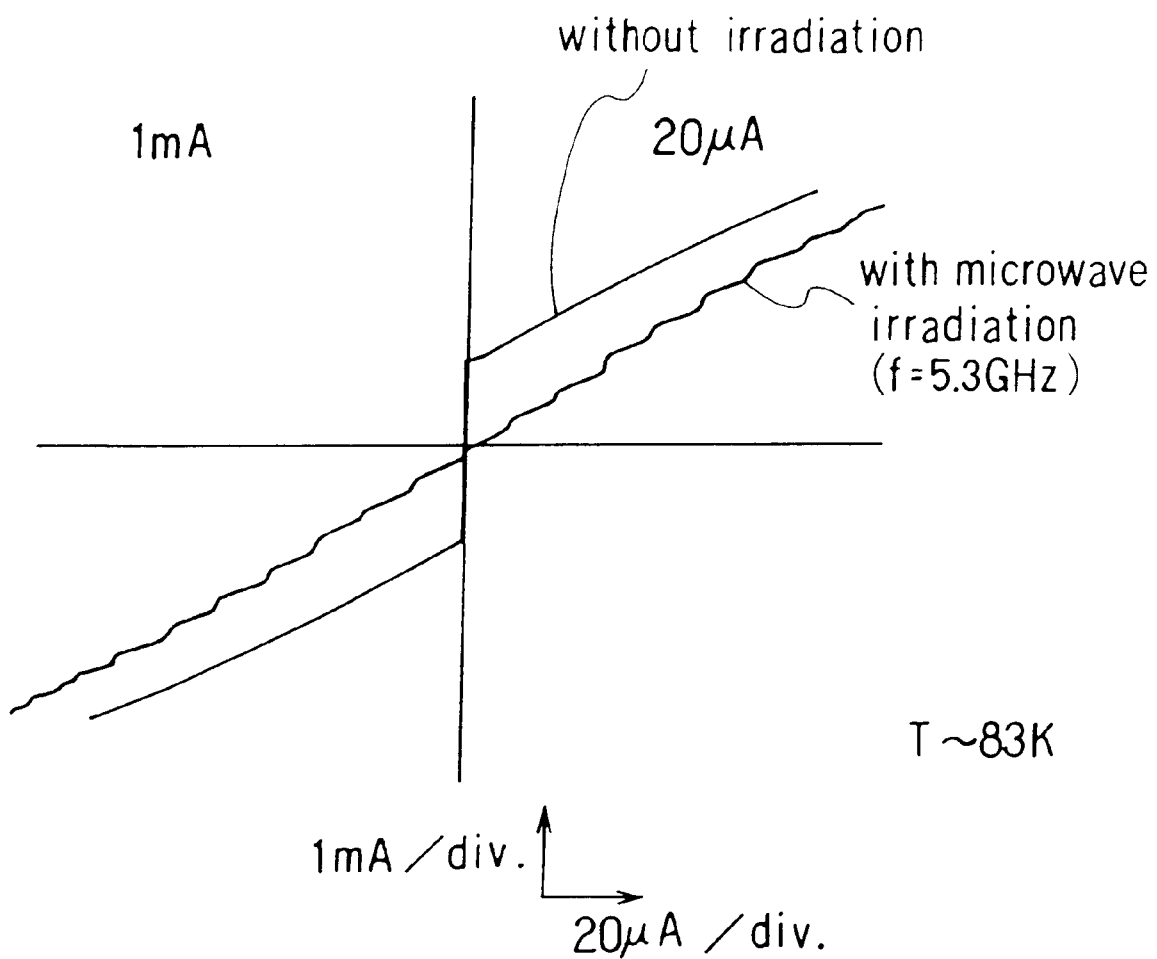
FIG. 3 shows the current-voltage characteristics of the superconducting device of FIG. 2.

FIG. 3 shows the current-voltage characteristics of a supercondcuting device in this embodiment. As is shown in FIG. 3, typical Shapiro steps were observed when microwave was irradiated to a superconducting device of this embodiment at a temperature of about 83 K. Accordingly, it was confirmed that a Josephson junction device was obtained.

According to the manufacturing method of a superconducting device in the embodiment described above, it is possible to form a grain boundary in the oxide superconducting thin film on the convex region 14, therefore a superconducting device having a Josephson junction can be relatively easily produced. In addition, by conducting high temperature annealing after depositing the oxide superconducting thin film 16 on the platinum thin film 12 on which the convex region 14 is formed, the crystal structure and the superconductivity of the oxide superconducting thin film can be improved, and the oxide thin film layer 16 of high resistance can also be formed between the platinum thin film 12 and the oxide superconducting thin film 17. Therefore, insulation between the platinum thin film 12 and the oxide superconducting thin film 17 can be easily provided.

The invention, however, is not limited to the method of manufacturing a Josephson junction device as described above, in which a $Bi_2Sr_2CaCu_2O_x$ oxide superconducting thin film 15 in polycrystalline or amorphous state was formed by sputtering on the substrate on which the convex region 14 was formed. For example, a Josephson junction device can be produced by the following steps. First, a $Bi_2Sr_2CuO_y$ oxide thin film showing semiconductive conductivity is deposited by sputtering on a substrate on which a convex region is formed. Then, a c-axis oriented $Bi_2Sr_2CaCu_2O_x$ oxide superconducting thin film is formed by sputtering at a substrate temperature of 650° C. in an atmosphere of mixture of argon and oxygen (containing 10% to 25% of oxygen) of 7.5 m Torr (about 1.0 Pa) without high temperature annealing. It was observed that the resulting Josephson junction device showed Josephson effect. However, in comparing $I_c'R_n$, which is the product of the critical current and the junction resistance, the $I_c'R_n$ of the device produced with high temperature annealing was about 1.5 mV, which is about twice as much as that of the device produced without high temperature annealing.

(Embodiment 2)

Figure 4:
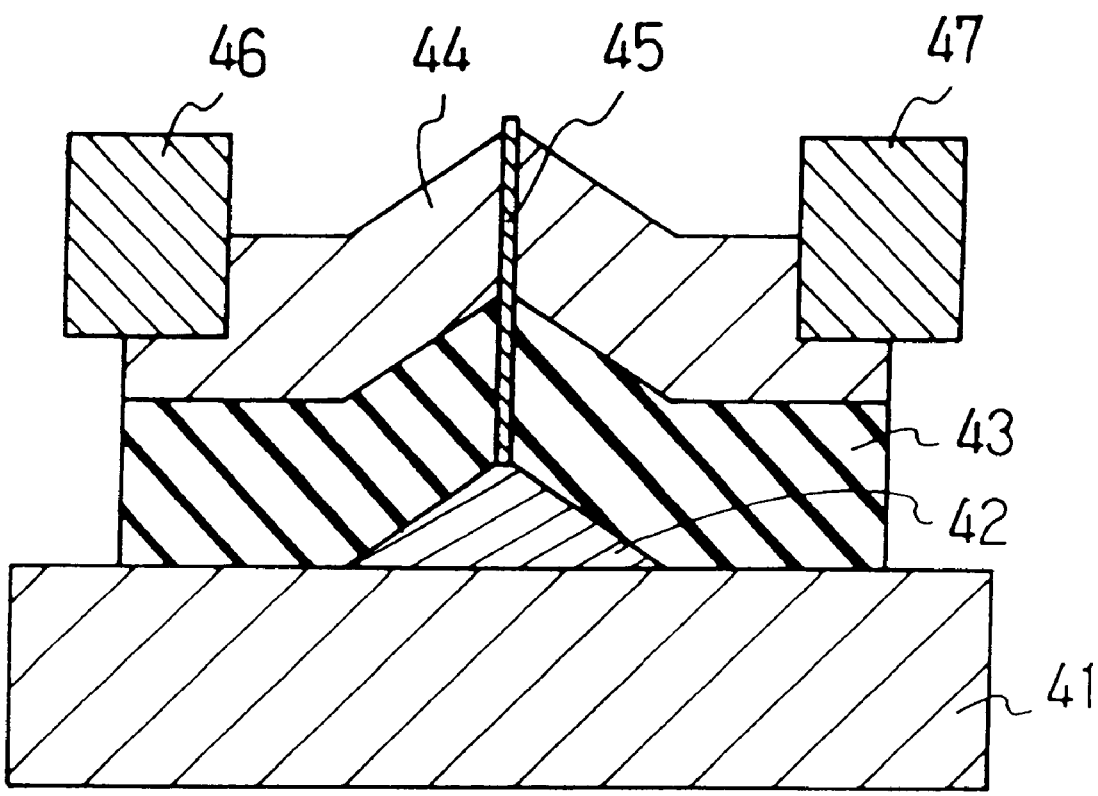
FIG. 4 is a cross-sectional view of a superconducting device in a second embodiment of the invention.

Next, a superconducting device in a second embodiment of this invention is described. Referring to FIG. 4, it shows a cross-section of a superconducting device in the second embodiment of this invention as viewed from a position perpendicular to the plane of the substrate. A superconducting device in this embodiment is produced by the following steps.

First, a platinum thin film having a thickness of about 150 nm was deposited on the entire surface of the substrate 41 by sputtering at a temperature of 500° C. with the substrate 41 in an argon atmosphere of 60 m Torr (about 8.0 Pa). The deposited platinum thin film was oriented to the (100) crystal plane. Although the thickness of the platinum thin film was set to be about 150 nm in this embodiment, this is not a necessity, and any thickness of the platinum thin film on which another film can be properly formed is acceptable. That is, any thickness of the platinum film which provides adequate wet-ability is acceptable. Accordingly, the thickness of the platinum thin film may be, for example, about 80 nm.

Then, the platinum thin film was processed to become linearly shaped (a linear platinum thin film 42) of 1 μm in width and 10 μm in length by etching technique using photolithography and Ar ions. For example, MgO monocrystal substrate can be used as the substrate 41 described above.

Then, a SrTiO₃ thin film 43 having a thickness of 500 nm was formed on the platinum thin film, and then a YBa₂Cu₃O₇ oxide superconducting thin film 44 having a thickness of 100 nm was formed on the SrTiO₃ thin film 43, each by sputtering and by causing epitaxial growth. These thin films were formed at a temperature of 650° C. of the substrate 41 in an atmosphere of mixture of argon and oxygen of 40 m Torr (about 5.3 Pa).

Then, a superconducting bridge having a wiring pattern of 1 μm in width and 10 μm in length was formed by an etching technique using photolithography and Ar ions so that it became almost the same shape as shown in FIG. 2 and crossed the processed region (the processed convex region).

FIG. 4 shows a cross-section of a superconducting device produced by the above described processes. In FIG. 4, 41 is the substrate, 42 is the processed line shaped platinum thin film, 43 is the SrTiO₃ thin film, 44 is the YBa₂Cu₃O₇ oxide superconducting thin film, 45 is the grain boundary part, and 46 and 47 are electrodes. FIG. 4 shows the structure of an electric field effect device controlling superconducting current which flows into the grain boundary by electric field when the processed linear platinum thin film 42 is used as a gate electrode, the electrode 46 and the electrode 47 are used as a source electrode and a drain electrode, respectively, and the SrTiO₃ thin film 43 is used as a gate barrier.

That is, FIG. 4 shows a superconducting device in which the convex region (the processed line shaped platinum thin film 42) of oriented metal is provided on the substrate 41 as a gate electrode, and an oxide insulating film (the SrTiO₃ thin film 43) is deposited on the convex region, and further the YBa₂Cu₃O₇ oxide superconducting thin film 44 is deposited on the oxide insulating film so that the grain boundary part 45 is formed on the convex region 42, and the drain electrode 46 and the source electrode 47 are formed facing each other with the grain boundary part 45 in between. In this device, conductance between the drain electrode 46 and the source electrode 47 was changed by applying voltage to the gate electrode (the platinum thin film 42). Accordingly, an electric field effect type device could be obtained.

According to the manufacturing method of a superconducting device in the embodiment as described above, the thickness and the characteristics of the channel layer of an electric field effect type device can be easily controlled so that the device can be easily produced.

Having described in this embodiment a process to form a gate electrode (the convex region 42) by an etching technique using photolithography and Ar ions as an example, it is to be understood that the invention is not limited to these processes. For example, the gate electrode part (the convex region 42) may be formed by applying electric field between the probe and the surface of the thin film substrate by using a scanning tunneling microscope.

(Embodiment 3)

Figure 5:
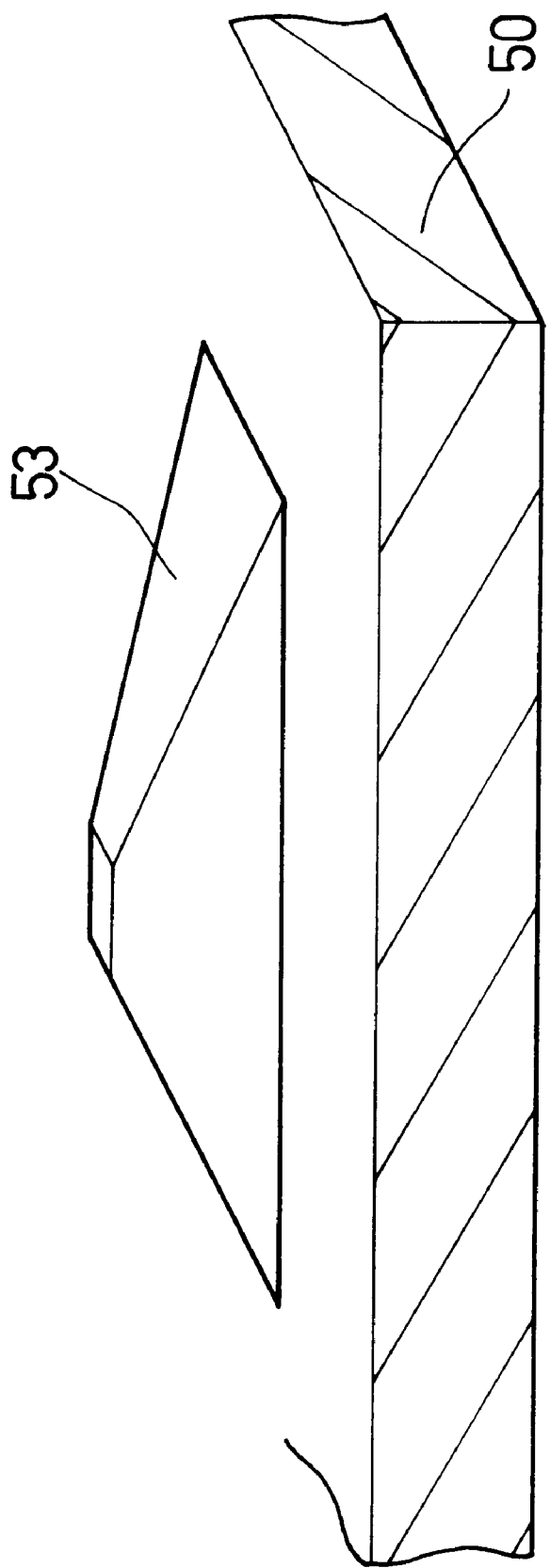
FIG. 5 is a perspective view showing a convex region of a superconducting device in a third embodiment of the invention.
Figure 6:
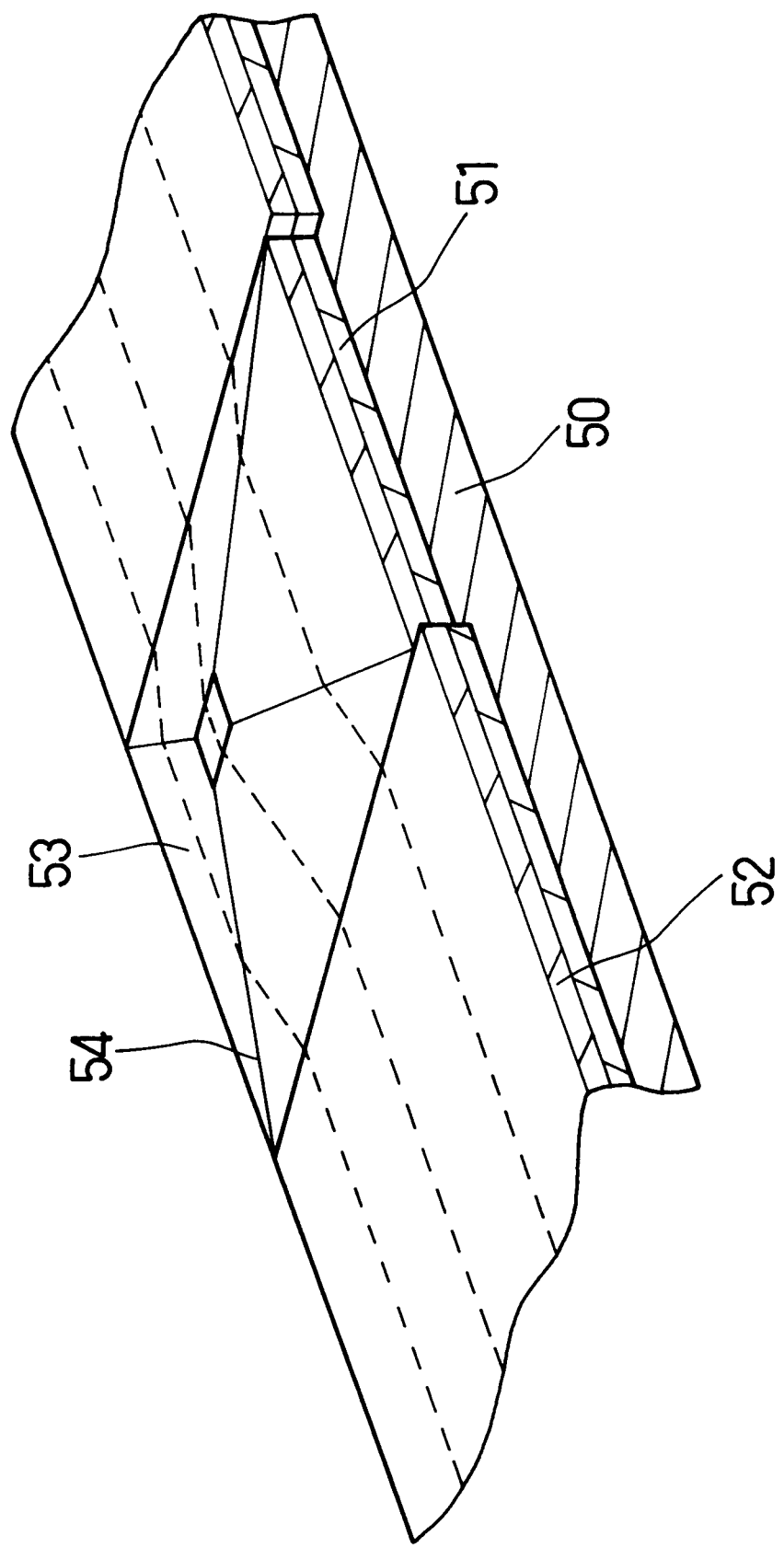
FIG. 6 is a perspective view showing a convex region, on which a superconducting thin film is formed, of a superconducting device in the third embodiment of the invention.

Next, a superconducting device in a third embodiment of the invention is described. Referring to FIG. 5, it shows a perspective view of a convex region of a superconducting device in the third embodiment, and FIG. 6 shows a perspective view of a convex region, on which a superconducting thin film is formed, of a superconducting device in the third embodiment. A superconducting device in this embodiment is produced by the following steps.

First, a platinum thin film having a thickness of about 100 nm was deposited on the entire surface of a SrTiO₃ monocrystal substrate by sputtering at a temperature of 500° C. with the substrate in an argon atmosphere of 60 m Torr (about 8.0 Pa). The resulting platinum thin film was oriented to the (100) crystal plane. It is to be understood that the substrate formed in this process (the platinum thin film having a thickness of about 100 nm formed on the SrTiO₃ monocrystal substrate) is hereinafter referred to as the "thin film substrate" 50 (cf. FIG. 5).

Next, by using a scanning tunneling microscope, a tunnel current of 2 nA was passed and a bias voltage of −4V was applied between the probe of the microscope and the surface of the thin film substrate 50. By this process, atoms on the surface of the thin film substrate 50 were induced, and a pyramid or truncated pyramid shaped convex region 53 was formed on the thin film substrate 50 (as viewed from a position perpendicular to the plane of the thin film substrate 50). That is, it was observed that a convex region 53 having a triangular or trapezoidal shape in section was formed on the thin film substrate 50 by using an atomic force microscope (AFM). The substrate formed in this process is hereinafter referred to as the "processed substrate."

Figure 7:
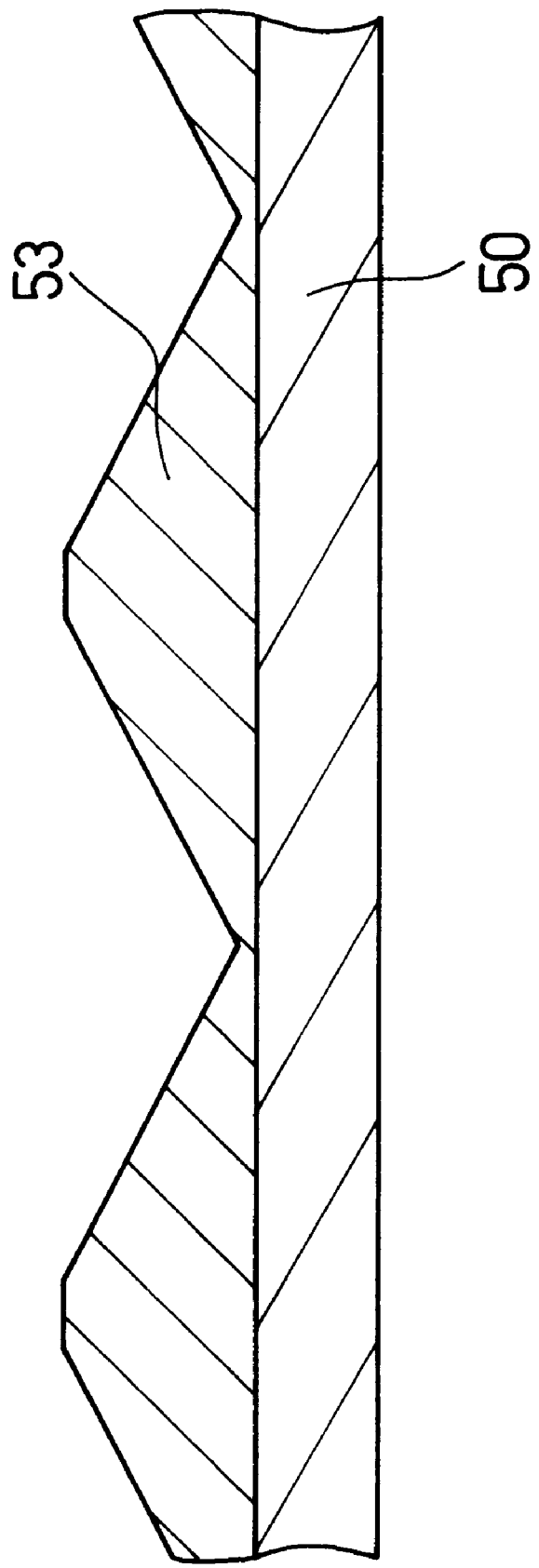
FIG. 7 is a cross-sectional view showing convex regions, which are arranged linearly, of a superconducting device in the third embodiment of the invention.

As shown in FIG. 7, a plurality of pyramid, truncated pyramid shaped or polygonal pyramid shaped convex regions 53 are arranged linearly according to pattern-size (as viewed from a position perpendicular to the plane of the substrate). In this case, convex regions 53 conduct each other.

Typically, the shape of the base of a pyramid or a truncated pyramid shaped convex region is triangle or quadrangle. One side of the base of the convex region is typically about 300 nm in length. The height of the convex region is typically about 10 nm.

In the embodiment shown in FIG. 5, a truncated quadrangular pyramid shaped convex region 53 was formed on the thin film substrate 50. One side of the base of a convex region 53 was about 250–350 nm in length. The height of the convex region 53 was about 8–15 nm. One side of the top of a convex region 53 was about 80–180 nm in length. The probe of the scanning tunneling microscope used in this embodiment may be made of gold or platinum.

Then, as shown in FIG. 6, a SrTiO$_3$ thin film 51 having a thickness of about 200 nm was formed on the processed substrate, and then a Bi$_2$Sr$_2$CaCu$_2$O$_x$ oxide superconducting thin film 52 having a thickness of about 200 nm was formed on the SrTiO$_3$ thin film 51, each by sputtering and by causing epitaxial growth. These thin films 51 and 52 were formed at a temperature of 650° C. of the substrate 50 in an atmosphere of mixture of argon and oxygen (containing 10% to 25% of oxygen) of 40 m Torr (about 5.3 Pa). As shown in FIG. 6, it was observed that a grain boundary 54 was formed in the Bi$_2$Sr$_2$CaCu$_2$O$_x$ oxide superconducting thin film 52 on the convex region 53.

Then, a superconducting bridge with a wiring pattern of 250 nm in width and 10 μm in length was formed to cross the convex region 53 by an etching technique using photo-lithography and Ar ions so that the grain boundary part became a grain boundary type Josephson junction. Such a wiring pattern can also be formed by an etching technique using electron beam or ion beam.

Then, a superconducting device having the same structure as that in FIG. 4 was produced. In this device, conductance between the drain electrode 46 and the source electrode 47 was changed by applying a voltage to the gate electrode (the platinum thin film 42).

The third embodiment was described referring to an example using a superconducting device having a quadrangular pyramid or truncated quadrangular pyramid shaped convex region 53. However, the present invention is not always limited to this configuration. For example, it was confirmed that a superconducting device having a polygonal pyramid or truncated polygonal pyramid shaped convex region can also operate in the same way as the third embodiment (as viewed from a position perpendicular to the plane of the substrate). See FIG. 7. In case of manufacturing a superconducting device using a polygonal pyramid or truncated polygonal pyramid shaped convex region, effective grain boundaries increase, so that junction resistance between the drain electrode and the source electrode is changed. However, in each case, it was confirmed that the part between the drain electrode and the source electrode functions as a Josephson junction. Furthermore, it was confirmed that conductance between the drain electrode and the source electrode was changed by applying a voltage to the gate electrode.

It is possible to arrange the above-mentioned convex regions with any position relationships based on the linear arrangement as shown in FIG. 7 corresponding to the pattern shapes. Furthermore, according to the configuration of a superconducting device in this embodiment, a superconducting device having minute patterns of submicron order can be obtained. As a result, it is possible to apply to a circuit for millimeter wave or terabit calculating circuit.

The invention may be embodied in other specific forms without departing from the spirit or essential characteristics thereof. The embodiments disclosed in this application are to be considered in all respects as illustrative and not respective, the scope of the invention being indicated by the appended claims rather than by the foregoing description, and all changes that come within the meaning and range of equivalency of the claims are intended to be embraced therein.

What is claimed is:

1. A superconducting device comprising a substrate, a convex region formed on said substrate, an oxide film on said convex region and an oxide superconducting film formed on said oxide film, wherein said convex region is a truncated pyramid, wherein each side face of said truncated pyramid has a slope.

2. The superconducting device as claimed in claim 1, wherein said convex region comprises of oriented metal.

3. The superconducting device as claimed in claim 2, wherein said oriented metal comprises platinum.

4. The superconducting device as claimed in claim 1, wherein said convex region is linearly shaped.

5. The superconducting device as claimed in claim 1, wherein said oxide film comprises an insulating film.

6. The superconducting device as claimed in claim 1, wherein said oxide film comprises an oxide compound selected from the group consisting of Bi$_2$Sr$_2$CaCu$_2$O$_x$, Bi$_2$Sr$_2$CuO$_y$ and SrTiO$_3$.

7. The superconducting device as claimed in claim 1, wherein said oxide superconducting film comprises an oxide compound selected from the group consisting of Bi$_2$Sr$_2$CaCu$_2$O$_x$ and YBa$_2$Cu$_3$O$_7$.

8. The superconducting device as claimed in claim 1, wherein said oxide film is formed by high temperature annealing.

9. The superconducting device as claimed in claim 8, wherein said oxide film is in a polycrystalline state.

10. The superconducting device as claimed in claim 8, wherein said oxide film is in an amorphous state.

11. The superconducting device as claimed in claim 1, wherein said oxide superconducting film is formed by high temperature annealing.

12. The superconducting device as claimed in claim 11, wherein said oxide superconducting film is in a polycrystalline state.

13. The superconducting device as claimed in claim 11, wherein a precursor to said oxide superconducting film is in an amorphous state.

14. The superconducting device as claimed in claim 1, further composing a grain boundary on said convex region.

15. The superconducting device as claimed in claim 14, further comprising a superconducting bridge across said convex region.

16. The superconducting device as claimed in claim 15, wherein said superconducting bridge is wiring pattern.

17. The superconducting device as claimed in claim 15, wherein said grain boundary is a Josephson junction.

18. The superconducting device as claimed in claim 15, wherein said superconducting device shows current-voltage characteristics having Shapiro steps when microwave is irradiated to said superconducting device at a temperature of about 83 K.

* * * * *

UNITED STATES PATENT AND TRADEMARK OFFICE
CERTIFICATE OF CORRECTION

PATENT NO. : 6,147,360
DATED : November 14, 2000
INVENTOR(S) : Odagawa et al.

It is certified that error appears in the above-identified patent and that said Letters Patent is hereby corrected as shown below:

Claim 6,
Line 4, change "$Bi_2Sr_2CuO_y$" to -- $Bi_2Sr_2CuO_y$ --

Signed and Sealed this

Second Day of October, 2001

Attest:

NICHOLAS P. GODICI
Attesting Officer     Acting Director of the United States Patent and Trademark Office